US006804805B2

(12) United States Patent
Rub

(10) Patent No.: US 6,804,805 B2
(45) Date of Patent: Oct. 12, 2004

(54) METHOD AND APPARATUS FOR ENCODING WITH UNEQUAL PROTECTION IN MAGNETIC RECORDING CHANNELS HAVING CONCATENATED ERROR CORRECTION CODES

(75) Inventor: Bernardo Rub, Edina, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 674 days.

(21) Appl. No.: 09/891,688

(22) Filed: Jun. 26, 2001

(65) Prior Publication Data
US 2001/0056561 A1 Dec. 27, 2001

Related U.S. Application Data
(60) Provisional application No. 60/214,699, filed on Jun. 27, 2000.

(51) Int. Cl.[7] .............................................. H03M 13/29
(52) U.S. Cl. ...................................... 714/752; 714/769
(58) Field of Search ................................. 714/752, 769

(56) References Cited

U.S. PATENT DOCUMENTS

| | | | | |
|---|---|---|---|---|
| 6,212,661 B1 | * | 4/2001 | Rub et al. | .................... 714/769 |
| 6,505,320 B1 | * | 1/2003 | Turk et al. | ................... 714/755 |
| 6,557,124 B1 | * | 4/2003 | Cideciyan et al. | .......... 714/701 |

* cited by examiner

Primary Examiner—Stephen M. Baker
(74) Attorney, Agent, or Firm—Westman, Champlin & Kelly

(57) ABSTRACT

An encoder and method of encoding data words are provided, which map a block of at least one of the data words into an error correction code (ECC) code word. The ECC code word is defined by a plurality of multiple-bit ECC symbols which are separated by boundaries. Bit patterns are constrained from occurring in the ECC code word based on a relative location of the bit patterns to the boundaries.

11 Claims, 6 Drawing Sheets

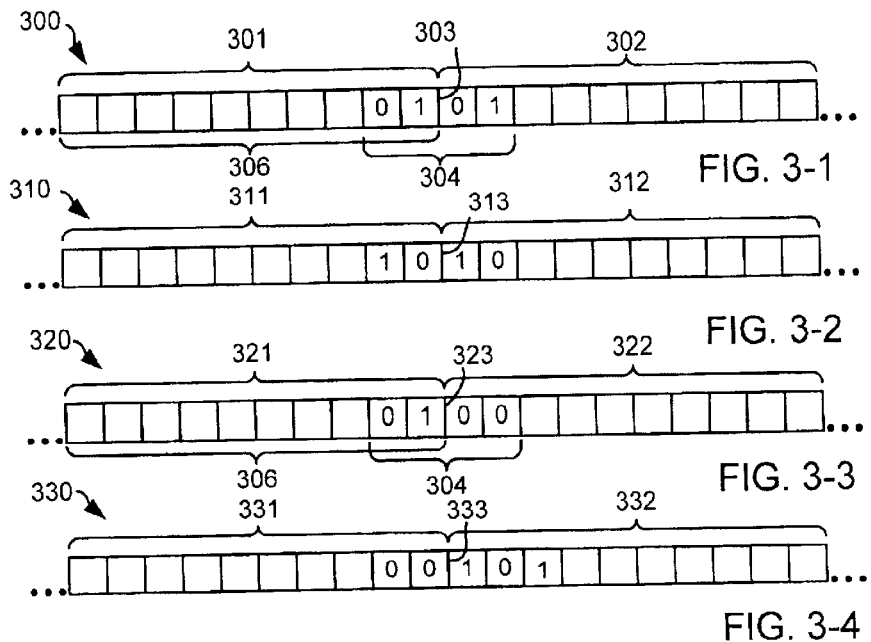
FIG. 3-1
FIG. 3-2
FIG. 3-3
FIG. 3-4
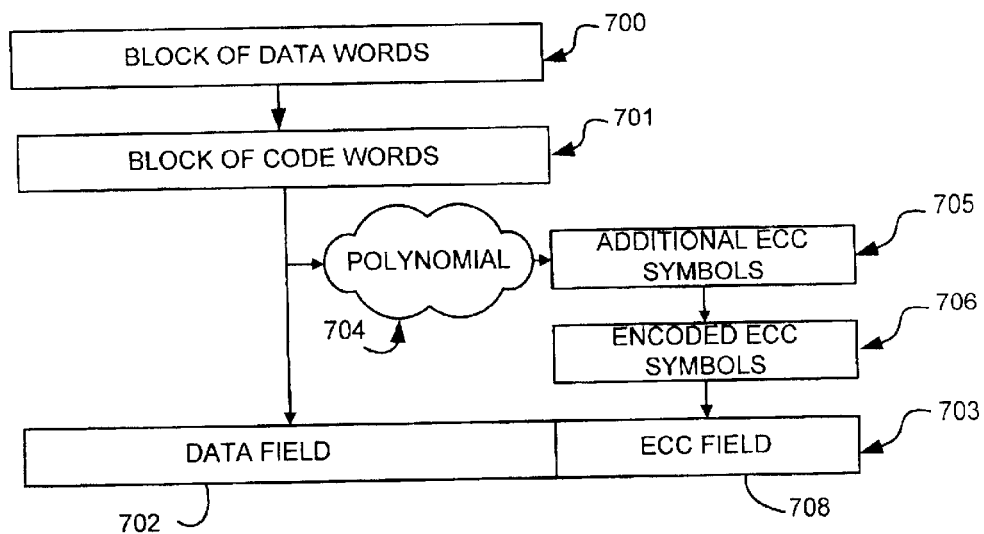
FIG. 7

METHOD AND APPARATUS FOR ENCODING WITH UNEQUAL PROTECTION IN MAGNETIC RECORDING CHANNELS HAVING CONCATENATED ERROR CORRECTION CODES

CROSS-REFERENCE TO RELATED APPLICATION

This application claims priority from U.S. Provisional Application having Ser. No. 60/214,699, filed on Jun. 27, 2000, and entitled "CODING WITH UNEQUAL PROTECTION FOR MAGNETIC RECORDING CHANNELS WITH CONCATENATED ERROR CORRECTION CODES".

BACKGROUND OF THE INVENTION

In the field of digital communication systems, digital information is conveyed from a transmitter to a receiver through a channel. "Channel" is a generalized term that can include many different mediums, such as recording media, telephone lines and electromagnetic spectrum. In data storage systems, such as magnetic disc drives, the channel includes a storage medium, and the digital information is transmitted to the storage medium and stored for some period of time before being recovered and delivered to the receiver.

A typical magnetic disc drive includes one or more rigid discs mounted for rotation on a hub or spindle. Each disc has an associated head formed of a hydrodynamic bearing and a transducer, for communicating with the surface of the disc. An electromechanical actuator moves the data head radially over the disc surface for track seek operations and holds the transducer directly over a desired track on the disc surface for track following operations. A drive controller controls the disc drive based on commands received from a host system to retrieve information from the discs and to store information on the discs. The drive controller includes various subsystems, such as a "host interface" for communicating with the host system, a "servo subsystem" for controlling the actuator, a "write channel" for recording data on a storage medium, and a "read channel" for receiving recorded data from the storage medium.

Information is typically stored in concentric data tracks on the disc surface. The direction of current through the transducer is controlled to encode magnetic flux reversals on the disc surface within the selected data track. In one type of coding, known as non-return-to-zero-inverse (NRZI) coding, a digital "one" is represented by a magnetic flux reversal from one magnetic domain to the next in the data track, and a digital "zero" is represented by a lack of a magnetic flux reversal from one magnetic domain to the next.

In retrieving data from the disc, the servo subsystem controls the electromechanical actuator so that the data head flies over the desired data track, senses the flux reversals stored in the data track, and generates a read signal based on those flux reversals. The read signal is typically conditioned and then decoded by the read channel to recover the data represented by the flux reversals. A typical read channel includes automatic gain control circuitry, a low-pass filter, an analog-to-digital converter or sampler, a sequence detector and a decoder.

A Viterbi detector has been used in the past for the sequence detector in the read channel. The Viterbi detector acts as a maximum-likelihood (ML) sequence detector when the input to the detector consists of a signal plus additive white, Gaussian noise, and when a typical branch metric (the square of the error in the signal provided to the detector) is used. The detected bit sequence is then passed to the decoder for decoding into the original user data.

All channels, including disc drive storage channels, introduce noise into the signals they convey. To detect and sometimes correct signal errors caused by channel noise, a large number of coding techniques have been developed. These coding techniques convert user data words formed of a number of data bits into code words formed of a number of code bits. Coding constraints imposed in the code words can be designed to avoid bit sequences that are prone to generating error events and can permit the detection and sometimes the correction of errors in the signals received from the channel.

The average ratio of the number of user data bits to the number of code bits, m/n, is known as the code rate of the code. In general, the ability to detect and correct errors in a received channel may be increased as the code rate decreases because a lower code rate means a greater amount of redundant information in the code word. However, each additional bit added by the encoder increases the time and energy needed to transmit the signal through the channel.

Several types of code constraints have been proposed. For example, in a disc drive, the rotational speed of the spindle motor that rotates the magnetic media varies over time. This results in non-uniform time intervals between read signal voltage pulses. A phase-locked loop (PLL) is used to lock the phase and frequency of the read timing clock to the phase and frequency of the read signal voltage pulses. To ensure that the PLL is updated regularly, a code can be used that limits the number of consecutive "zeros" in the read signal to no greater than a maximum number "k". This kind of code is known as a run-lengthlimited (RLL) code with a "k" constraint. The smaller value of "k", the better the performance of the PLL. However, the smaller the value of "k", the more difficult the code becomes to implement.

The code may also limit the number of consecutive "ones" in an encoded bit stream to limit the effects of inter-symbol interference, which occurs when consecutive transitions in the transmitted signal interfere with each other. Such codes are known as maximum transition run (MTR) codes with a "j" constraint, where "j" is the maximum number of consecutive transitions allowed in the channel signal. For example, to avoid three or more consecutive transitions, codes with an MTR constraint j=2 can be designed. Although MTR codes reduce inter-symbol interference, they eliminate a large number of available code words making it difficult and sometimes impossible to implement MTR constraints with high code rates.

Some magnetic recording channels provide further protection by using error correction codes (ECCs). Successive blocks of data (coded or uncoded) are mapped into successive error correction code words having a data field and an ECC field. The block of data is mapped into the data field, which is divided into a number of multiple-bit ECC symbols. The ECC symbols in the data field are applied to a polynomial function, which generates additional, multiple-bit ECC symbols called "parity bits" that form the ECC field. The number of additional ECC symbols that are concatenated to the data field determines the number of ECC symbols in the ECC code word that can be corrected. For example, with a Reed-Solomon type of ECC, two additional ECC symbols are required to correct one symbol in the ECC code word. An ECC code word having 24 additional ECC symbols concatenated in the ECC field would have the ability to correct error events in up to 12 symbols in the ECC code word.

An ECC decoder is then used in the read channel to detect and correct errors in the ECC code words. For each symbol in the received ECC code word that does not match the corresponding symbol in the transmitted ECC code word, the ECC decoder determines the correct symbol based on the other symbols in the received code word and the polynomial function that was used to generate the additional symbols.

While these coding techniques are effective in avoiding certain error events and providing a means for correcting most remaining error events, they are difficult to implement with high code rates. This limits the efficiency of the code and the speed of the recording channel. The present invention addresses these and other problems, and offers other advantages over the prior art.

SUMMARY OF THE INVENTION

One aspect of the present invention relates to a method of encoding data words in which a block of at least one of the data words is mapped into an error correction code (ECC) code word. The ECC code word is defined by a plurality of multiple-bit ECC symbols which are separated by boundaries. Bit patterns are constrained from occurring in the ECC code word based on a relative location of the bit patterns to the boundaries.

Another aspect of the present invention is directed to an encoder for encoding successive data words into respective, successive code words. The encoder includes a data word input; a code word output; and a first encoder unit. The first encoder unit maps each successive data word received on the data word input into a respective, successive code word on the code word output according to a first code. The first code identifies in each code word boundaries between multiple-bit error correction code (ECC) symbols and imposes different code constraints on bit positions in each code word that are closer to the boundaries than bit positions in each code word that are farther from the boundaries.

Another aspect of the present invention is directed to a disc drive storage channel which includes a transducer and an encoder. The transducer is capable of communicating with a data storage disc. The encoder is coupled to the transducer for encoding data into successive error correction code (ECC) code words formed of multiple-bit ECC symbols according to a code. The code constrains bit patterns from occurring in each ECC code word based on a relative location of the bit patterns to boundaries between the multiple-bit ECC symbols. The encoder then transmits the ECC code words to the transducer as a code word stream.

Yet another aspect of the present invention is directed to a disc drive storage channel which includes a transducer and a decoder. The transducer is capable of communicating with a data storage disc. The decoder is coupled to the transducer for receiving a read signal from the transducer and for decoding successive error correction code (ECC) code words represented by the read signal into successive data words according to a code. Each ECC code word includes a plurality of multiple-bit ECC symbols, and the code constrains bit patterns in each ECC code word based on a relative location of the bit patterns to boundaries between the multiple-bit ECC symbols.

BRIEF DESCRIPTION OF THE DRAWINGS

FIGS. 3-1 and 3-2 are diagrams which illustrate portions of ECC code words that contain illegal NRZ bit patterns, which are avoided by encoders and decoders used in the storage channel shown in FIG. 2.

FIGS. 3-3 and 3-4 are diagrams which illustrate portions of ECC code words that contain some of the legal NRZ bit patterns, which are allowed by an encoder and a decoder used in the storage channel shown in FIG. 2.

FIG. 4 is a graph which plots a corrected bit error rate as a function of an event error rate for coded and uncoded channels having concatenated ECC codes.

FIG. 7 is a diagram illustrating the data flow through the ECC encoder and the bit level encoder shown in FIG. 2.

DETAILED DESCRIPTION OF ILLUSTRATIVE EMBODIMENTS

Figure 1:
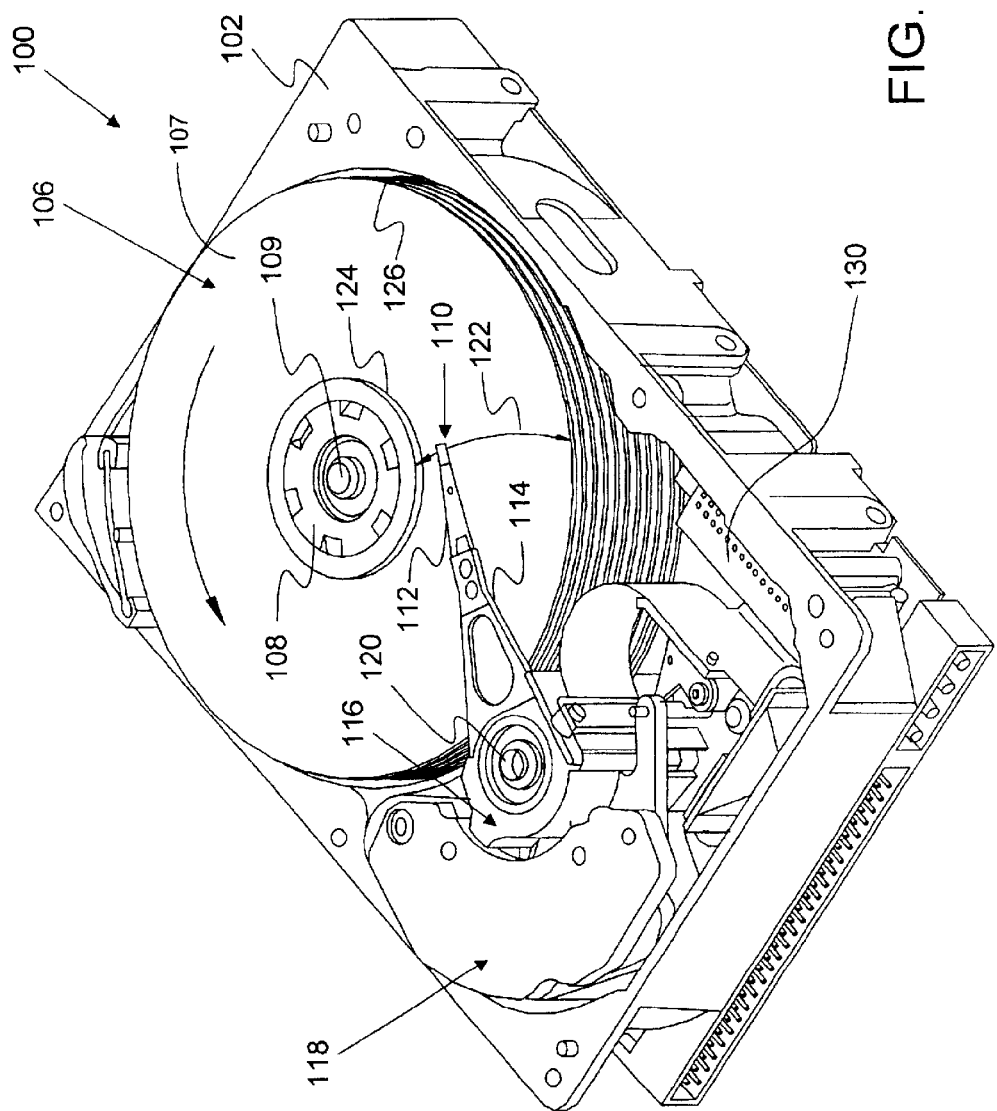
FIG. 1 is a perspective view of disc drive in which aspects of the present invention may be practiced.

FIG. 1 is a perspective view of a disc drive 100 in which the present invention is useful. Disc drive 100 includes a housing with a base 102 and a top cover (not shown). Disc drive 100 further includes a disc pack 106, which is mounted on a spindle motor (not shown), by a disc clamp 108. Disc pack 106 includes a plurality of individual discs, which are mounted for co-rotation about central axis 109. Each disc surface has an associated disc head slider 110 which is mounted to disc drive 100 for communication with the disc surface. In the example shown in FIG. 1, sliders 110 are supported by suspensions 112 which are in turn attached to track accessing arms 114 of an actuator 116. The actuator shown in FIG. 1 is of the type known as a rotary moving coil actuator and includes a voice coil motor (VCM), shown generally at 118. Voice coil motor 118 rotates actuator 116 with its attached heads 110 about a pivot shaft 120 to position heads 110 over a desired data track along an arcuate path 122 between a disc inner diameter 124 and a disc outer diameter 126. Voice coil motor 118 is driven by servo electronics located in internal circuitry 128 based on signals generated by heads 110 and a host computer (not shown).

Write circuitry within internal circuitry 128 encodes the data to be stored into successive code words, which are then precoded into a non-return-to-zero-inverse (NRZI) format (or, alternatively, an NRZ format) and modulated to form a serial analog write signal. The write transducer on head 110 encodes magnetic flux reversals within a magnetic layer on the disc surface based on the analog write signal. During read operations, the read transducer in head 110 senses the magnetic flux reversals and generates a serial analog read signal. The analog read signal is converted into a serial digital signal, which is provided to detector and decoder circuitry within internal circuitry 128 to produce a recovered data signal.

Figure 2:
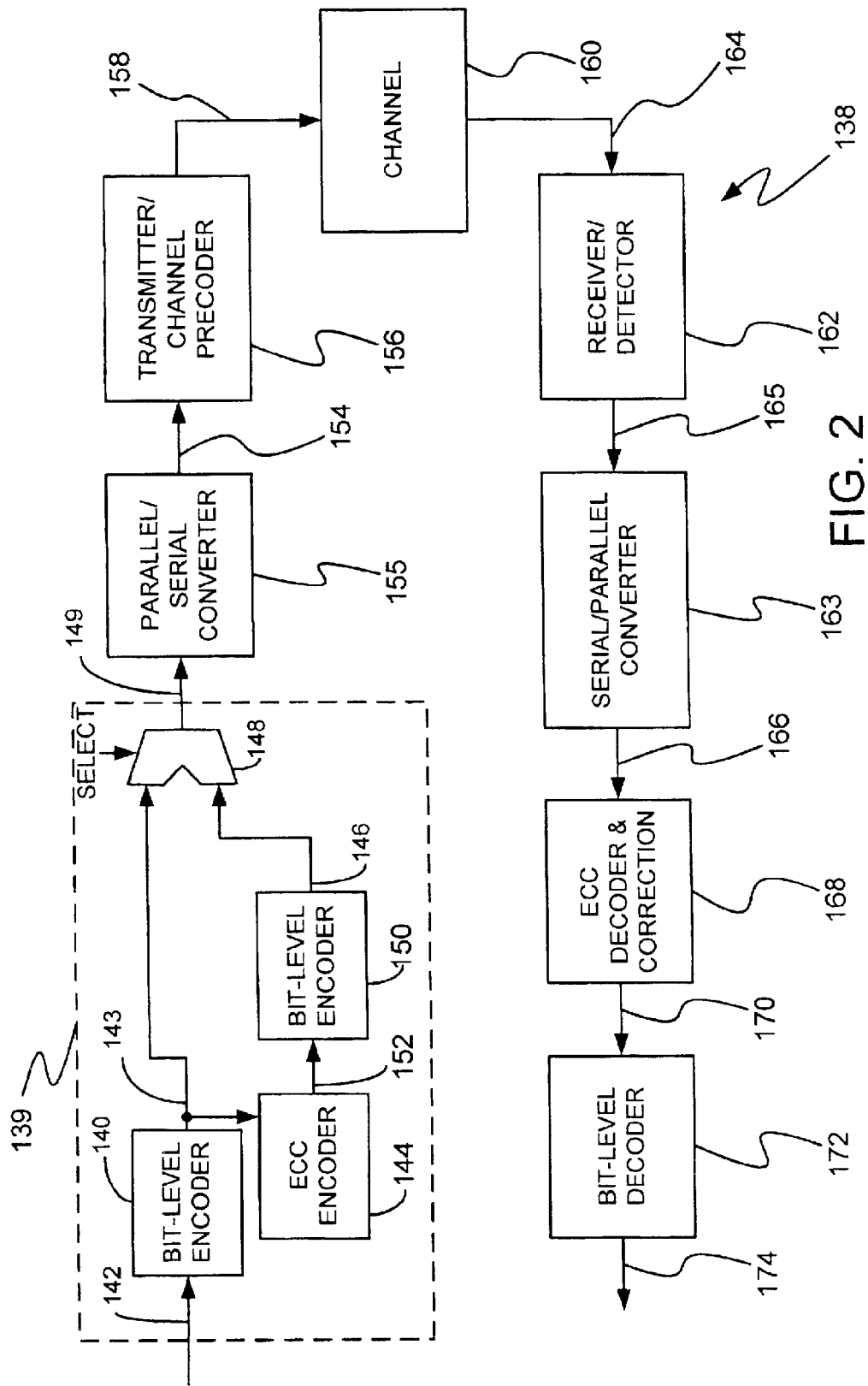
FIG. 2 is a block diagram of a data storage channel within the disc drive shown in FIG. 1, according to one embodiment of the present invention.

FIG. 2 is a block diagram of a generalized communication system 138 used with the present invention. For the disc drive of FIG. 1, communication system 138 is formed by head 110, disc 106, and internal logic in circuitry 128. Communication system 138 includes an encoder circuit 139, which includes a first bit-level encoder 140, a symbol-level Error Correction Code (ECC) encoder 144, a multiplexer 148 and a second bit-level encoder 150. Bit-level encoder 140 receives successive data words 142 and encodes the successive data words into successive data code words 143 according to a code. Each data word 142 can include any number of bits. The greater the number of bits, the greater the code rate that can be achieved by encoder 140. The code constrains the successive data code words 143 on a bit level to avoid code words with bit patterns that are known to cause certain common error events in channel 160.

For example, the code can include a Run Length Limited (RLL) code with a "k" constraint. The "k" constraint limits the number of consecutive zeros in the read signal to no greater than a maximum number "k". The code can also limit the number of consecutive ones in an encoded bit stream to limit the effects of inter-symbol interference, which occurs when consecutive transitions in the transmitted signal interfere with each other. Such codes are known as maximum transition run (MTR) codes with a "j" constraint, where "j" is the maximum number of consecutive transitions allowed in the channel signal. Other types of codes can be used by encoder 140 in addition to or in replace of the code types mentioned above. In one embodiment described in more detail below, the code imposes different constraints on different bit positions in each data code word 142, based on the relative position each bit will have in multiple-bit ECC symbols. This requires the code implemented by encoder 140 to identify ECC symbol boundaries within each data code word 143.

Encoder 140 can include a block encoder or can be state driven, and all code words 143 are carefully chosen to avoid code words that cause common error events. Encoder 140 can be implemented with combinational logic or in software with a look-up table for making the conversion between each user data word and its corresponding code word. Other hardware and software implementations can also be used.

The successive data code words 143 generated by encoder 140 are provided to one input of multiplexer 148 and to ECC encoder 144, which together encode successive blocks (or sectors) of the data code words 143 into successive ECC code words (also known as ECC blocks or sectors) 149 at the output of multiplexer 148. Each ECC code word 149 includes a data field and an ECC field, which are each formed of one or more multiple-bit ECC symbols. Multiplexer 148 maps each block of data code words 143 into the data field of a corresponding ECC code word 149 to form one or more ECC symbols within the data field.

ECC encoder 144 generates additional ECC symbols 152 for the ECC field based on the ECC symbols in the data field. For example, the additional ECC symbols can be generated by applying the ECC symbols in the data field to a polynomial function. The number of additional ECC symbols concatenated in the ECC field determines the total number of correctable ECC symbols in each ECC code word. For example, one particular ECC may require two additional ECC symbols for each correctable ECC symbol in the ECC code word. Any type of ECC can be used, such as a Reed-Solomon ECC.

Bit-level encoder 150 encodes the additional ECC symbols 152 and applies similar code constraints as were applied to data code words 142 by encoder 140. Again, the code imposes different constraints on different bit positions, based on the relative position of each bit in the ECC symbol. In one embodiment, each ECC symbol is encoded into a corresponding encoded ECC symbol 146. Since there is a smaller number of bits in each additional ECC symbol 152 than in each data word 142, the code rate of bit-level encoder 150 is smaller that the code rate of bit-level encoder 140. In an alternative embodiment, a plurality of additional ECC symbols are encoded together into a corresponding code word. The resulting encoded ECC symbols 146 are then provided to the other input of multiplexer 148.

Multiplexer 148 maps each block of data code words 143 into the data field of a corresponding ECC code word 149 and maps a respective set of additional encoded ECC symbols 146 into the ECC field of the corresponding ECC code word 149 by time-multiplexing the inputs of the multiplexer. Other structures and methods can be used to concatenate the encoded additional ECC symbols 146 to the data field of a corresponding ECC code word 149 in alternative embodiments.

Parallel-to-serial converter 155 receives the successive ECC code words 149, converts each ECC code word 149 into a serial representation and concatenates the serial representations to produce a serial stream of ECC code word bits 154. Transmitter/precoder 156 receives the serial code word stream 154 and conditions the sequence so that it is optimized for the type of detector used to recover the signal from the channel. Transmitter/precoder 156 produces an encoded write signal 158, which is provided to channel 160.

In disc drive 100, channel 160 includes the write transducer in head 110, disc pack 106, and the read transducer in head 110. The encoded write signal is stored on the disc surface by the write transducer. During a read operation, the read transducer reads the stored, encoded information from the disc surface and conveys the encoded information to receiver/detector 162 as a read signal 164. Receiver/detector 162 amplifies and filters read signal 164, and then recovers the encoded information from the read signal using one of several known detection methods. For instance, receiver/detector 162 may use a Viterbi detector, Decision Feedback Equalization (DFE), Fixed-Delay Tree Search with Decision Feedback (FDTS/DF) or Reduced State Sequence detection (RSSE). After detecting and amplifying the signal from channel 160, receiver/detector 162 produces a recovered sequence of code word bits 165, which are provided to serial-to-parallel converter 163.

Serial-to-parallel converter 163 groups the bits into ECC code words and converts the ECC code words from a serial format to a parallel format. Successively recovered ECC code words 166 have lengths corresponding to the lengths of the ECC code words generated by encoder 139. Serial-to-parallel converter 163 then outputs the successively recovered ECC code words 166 in parallel format to ECC decoder and correction circuit 168. Circuit 168 uses the inverse of the coding rules used by encoder 150 to decode the additional ECC symbols in the ECC field into the original ECC symbols and, based on the ECC symbols in the ECC code word 166 and the polynomial function used by ECC encoder 144, determines whether any of the ECC symbols contains an error. As long as the number of ECC symbols containing an error is not greater than the maximum number of symbols that can be corrected by circuit 168, the original transmitted ECC symbols are recovered.

The data field is then stripped from the recovered ECC code word to recover the original block of data code words 170, which is then provided to decoder 172. Bit-level decoder 172 uses the inverse of the coding rules used by encoder 140 to decode the successive data code words 170 into respective data words 174.

As mentioned above, bit-level encoders 140 and 150 provide unequal error protection for different bit locations in each ECC symbol. In one embodiment, more error protection is provided to bit locations near the ECC symbol boundaries than to the bit locations near the middle of each ECC symbol. This is done by applying one set of code constraints to the "outer" bit locations of each ECC symbol and another set of code constraints to the "inner" bit locations of each ECC symbol.

This provides greater protection against error events that have greater impact on the ability of ECC decoder and correction circuit 168 to correct errors. The code used by encoders 140 and 150 provides greater protection against errors that span ECC symbol boundaries than errors that do not span ECC symbol boundaries. Error events that span ECC symbol boundaries result in errors in two consecutive ECC symbols. By avoiding these multiple-symbol error events, the total number of ECC symbols containing an error in each ECC code word is reduced, and there is a greater likelihood that circuit 168 can recover all ECC symbols in a given ECC code word.

Also, by allowing certain bit patterns to occur in the "inner" bit positions of each ECC symbol that are not allowed in the "outer" bit positions, a relatively high code rate can be maintained, since only the bit patterns affecting the ECC symbol boundaries are constrained. Thus, a greater number of the total possible number of bit patterns can be used.

With magnetic recording channels, the most likely error events are one-bit and three-bit error events. A one bit error event will always result in a one bit ECC symbol error. A three-bit error event can result in two ECC symbol errors if it spans an ECC symbol boundary. In one embodiment, encoders 140 and 150 use a boundary MTR code for removing "tri-bit" error events at the ECC symbol boundaries. The code eliminates two NRZ patterns (or one NRZI pattern) that results in a tri-bit with the middle transition at the ECC symbol boundary.

FIGS. 3-1 and 3-2 are diagrams which illustrate portions of ECC code words that contain illegal NRZ bit patterns, which are avoided by encoders 140 and 150. As mentioned above, each ECC code word is formed of a plurality of multiple-bit ECC symbols that are concatenated with one another in the data and ECC fields. In FIG. 3-1, ECC code word 300 includes 10-bit ECC symbols 301 and 302, among others, which have a boundary 303 between them. Each ECC symbol in ECC code word 300 has one or more "outer" bit positions 304 and one or more "inner" boundary bit positions 306, which may overlap one another. The NRZ pattern formed by a "01" at the "outer" boundary bit positions of ECC symbol 301 and a "01" at the "outer" boundary bit positions of ECC symbol 302 results in three transitions, with the middle transition occurring at the boundary 303. In FIG. 3-2, ECC code word 310 includes ECC symbols 311 and 312, among others, which have a boundary 313 between them. Similar to the pattern shown in FIG. 3-1, the NRZ pattern "1010" results in three transitions, with the middle transition occurring at the boundary 313 between the two ECC symbols 311 and 312. These bit patterns are avoided by encoders 140 and 150 in the "outer" boundary bit positions 304, but are allowed in the "inner" bit positions 306.

Figure 4:
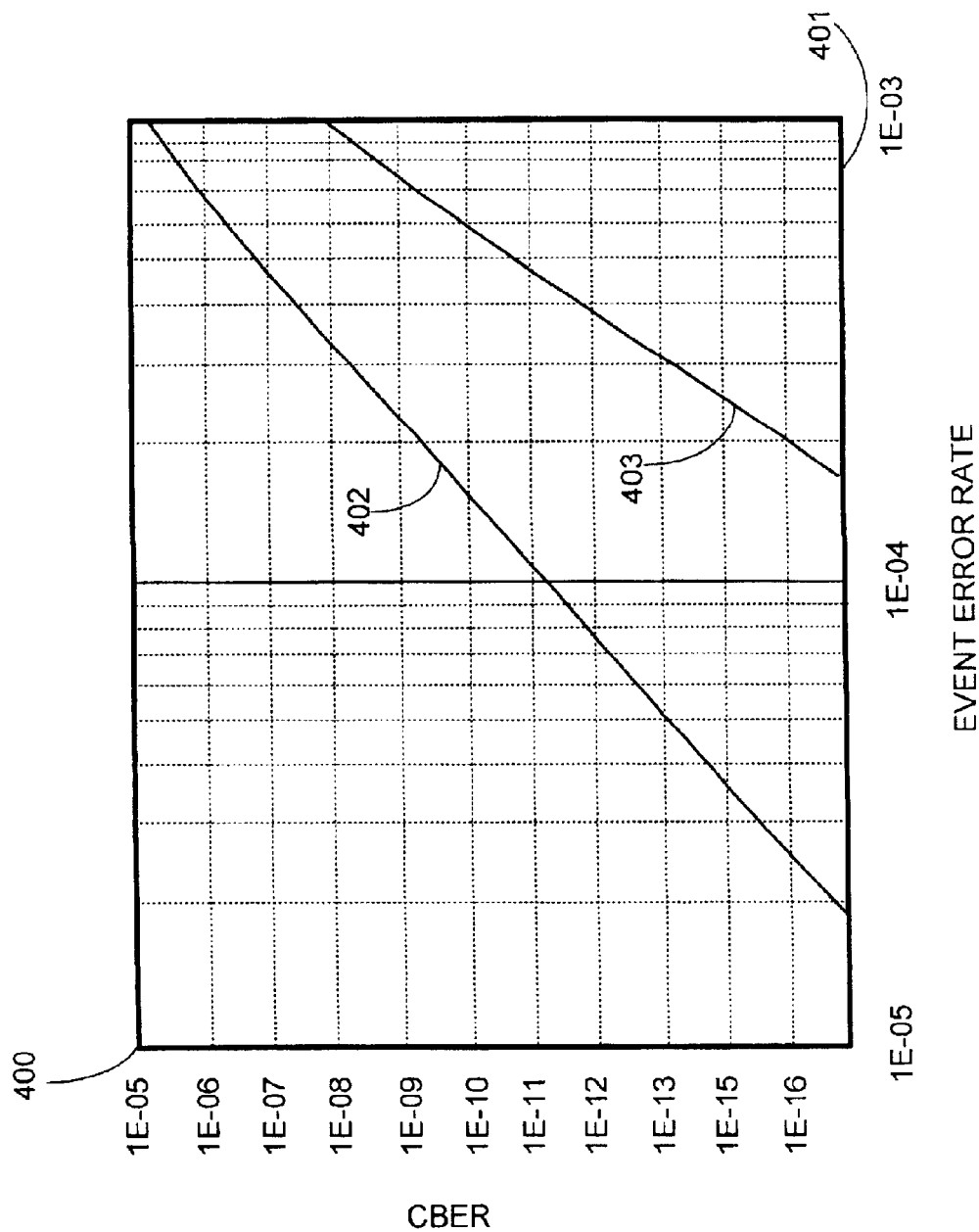

FIGS. 3-3 and 3-4 are diagrams which illustrate portions of ECC code words that contain some of the legal NRZ bit patterns, which are not avoided by encoders 140 and 150. In FIG. 3-3, ECC code word 320 includes ECC symbols 321 and 322, among others, which have a boundary 323 between them. Although the NRZ pattern "10100" results in three transitions, the middle transition does not occur at the boundary 313, within "outer" bit positions 304. In FIG. 3-4, ECC code word 330 includes ECC symbols 331 and 332, among others, which have a boundary 333 between them. Similar to the pattern shown in FIG. 3-3, the NRZ pattern "00101" results in three transitions, but the middle transition does not occur at the boundary 333 between the two ECC symbols 331 and 332.

Eliminating the patterns shown in FIGS. 3-1 and 3-2 with encoders 140 and 150 and imposing the corresponding constraints on decoders 168 and 172, remove the two possible tri-bit error events at the ECC symbol boundaries and any larger error events that include tri-bits at the ECC symbol boundaries. The same constraints are not imposed on tri-bit error events that occur at the inner bit positions 306 of a single ECC symbol. Therefore bit locations near the boundaries of ECC symbols have a lower bit error rate probability than bit locations within an ECC symbol.

MTR codes that eliminate all tri-bit error events have the disadvantage of a large code rate penalty, since a large number of code bits must be used to avoid all bit patterns that result in a tri-bit. In the above-embodiment of the present invention, an efficient compromise is achieved by avoiding all tri-bit error events at the ECC symbol boundaries, but not the remaining tri-bit error events. Since the remaining tri-bit error events are limited to a single ECC symbol, there is a greater likelihood that these error events will be correctable by the ECC decoder. Avoidance of these errors by an MTR code on the bit level is not necessary. The MTR code constraints can therefore be relaxed, resulting in a higher achievable code rate.

As an example, assume that channel 160 (shown in FIG. 2) has only tri-bit errors. Assume that ECC encoder 144 forms 10-bit symbols and ECC decoder 168 has the capacity to correct up to 12 ECC symbols in each ECC code word. With no coding by encoders 140 and 150 (also shown in FIG. 2), it takes 7 error events in an ECC code word to exceed the ECC capability. If the 7 error events all occur at an ECC symbol boundary, then 14 ECC symbols will have errors, which exceeds the 12 ECC symbol error capacity. If one parity bit is used per ECC code word, it takes 8 error events in an ECC code word to exceed the ECC capability. With a boundary MTR code (which avoids tri-bit errors at the ECC symbol boundaries) and no parity, it takes 13 error events in an ECC code word to exceed the ECC capability.

FIG. 4 is a graph which plots the corrected bit error rate on Y-axis 400 as a function of the event error rate on X-axis 401 for coded and uncoded channels having concatenated ECC codes. The corrected bit error rate is the ratio of the number of uncorrectable ECC code words (sectors) divided by the number of bits read. Line 402 represents the corrected bit error rate for the uncoded example, and line 403 represents the corrected bit error rate for the boundary MTR coded example. The boundary MTR coded example clearly has less uncorrectable ECC code words than the uncoded example.

Figure 5:
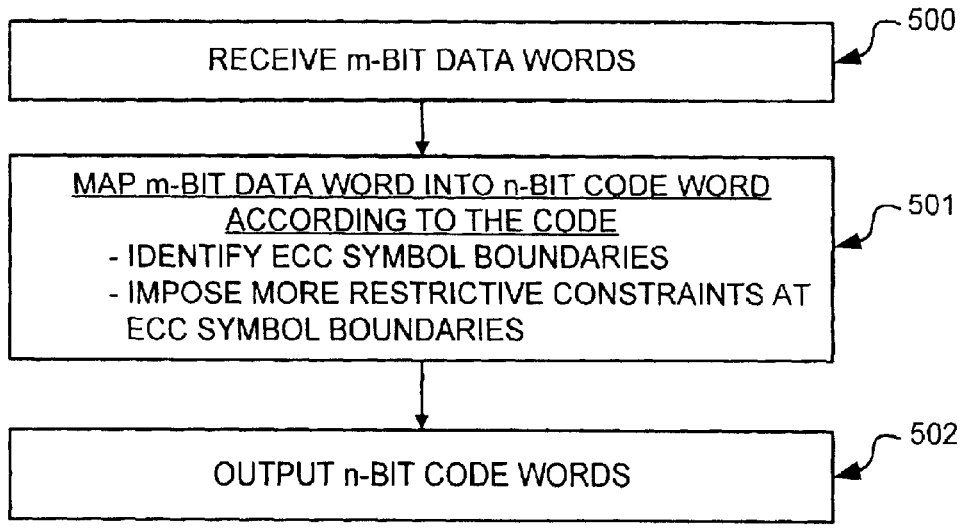
FIG. 5 is a diagram, which illustrates an encoding process performed by a first, bit-level encoder shown in FIG. 2, according to one embodiment of the present invention.

FIG. 5 is a diagram, which illustrates the encoding process performed by encoder 140, according to one embodiment of the present invention. At step 500, encoder 140 receives successive m-bit data words for encoding. At step 501, encoder 140 maps each successive m-bit data word into a respective, successive n-bit code word according to a code. The code identifies in each code word boundaries between multiple-bit ECC symbols that will be defined subsequently by ECC encoder 144 and imposes different code constraints on bit positions in each code word that are closer to the ECC boundaries than bit positions in each code word that are farther from the ECC boundaries. At step 502, encoder 140 outputs the resulting code words to ECC encoder 144.

Figure 6:
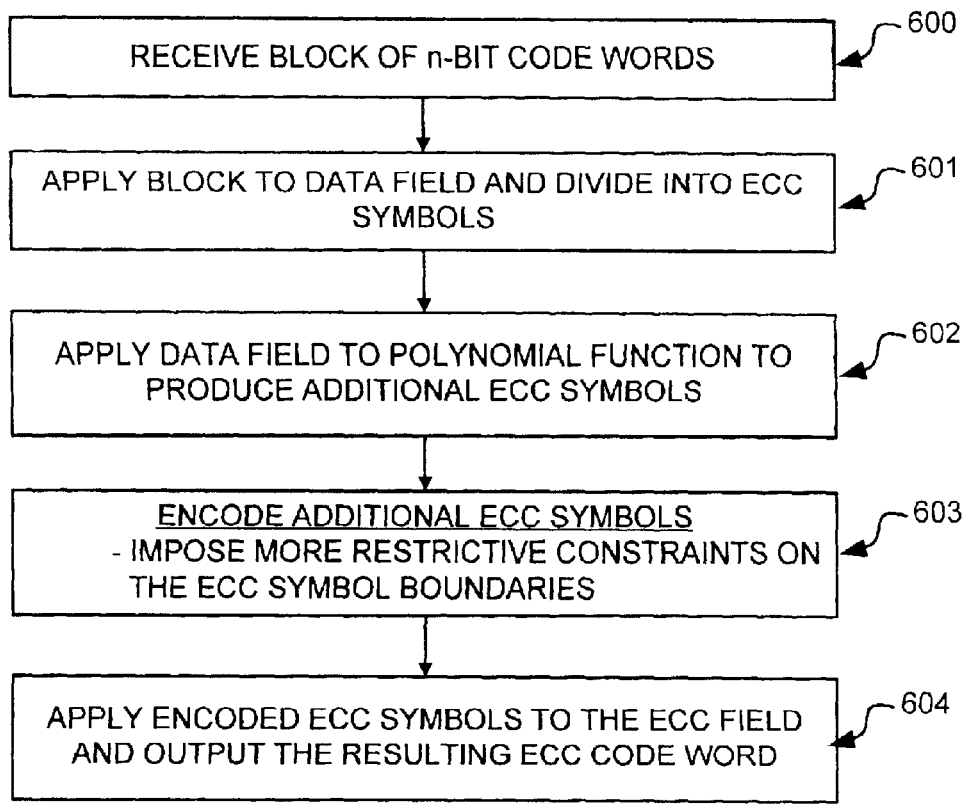
FIG. 6 is a flow chart illustrating a process performed by an ECC encoder and a second bit-level encoder shown in FIG. 2, according to one example of the present invention.

FIG. 6 is a flow chart illustrating the process performed by encoders 144 and 150, according to one example of the present invention. At step 600, ECC encoder 144 receives a block of coded data words from encoder 140. At step 601, ECC encoder 144 applies the block of data words to the data field of a corresponding ECC code word, which is divided into a plurality of multiple-bit ECC symbols. The ECC symbols in the data field are applied to a polynomial, at step 601, which is used to generate additional ECC symbols that will be concatenated to the data field. At step 603, bit-level encoder 150 maps the additional ECC symbols into encoded ECC symbols according to a code that imposes the same constraints as were applied by bit-level encoder 140 to avoid tri-bits at the ECC symbol boundaries. At step 604, the encoded ECC symbols are applied to the ECC field of the ECC code word, which is concatenated to the data field. The resulting encoded ECC code word is then output to the next stage in the write channel.

FIG. 7 is a diagram illustrating the data flow through encoder 139 according to one example of the present invention. Encoder 140 (shown in FIG. 2) encodes a block of data words 700 into a block of respective encoded data words 701. The block of encoded data words 701 is applied directly to the data field 702 of an ECC code word 703. Data field 702 is divided into a plurality of multiple-bit ECC symbols. In an alternative embodiment, ECC encoder 144 applies a polynomial function to the block of encoded data words to produce the ECC symbols in data field 702. The block of encoded data words 701 is also applied to a polynomial 704, which generates additional ECC symbols 705. Any suitable polynomial can be used to implement the desired error correction code. Encoder 150 then encodes the additional ECC symbols into encoded ECC symbols 706, which are applied to ECC field 708 of ECC code word 703. This is an example of a "systematic" type of encoder.

Figure 8:
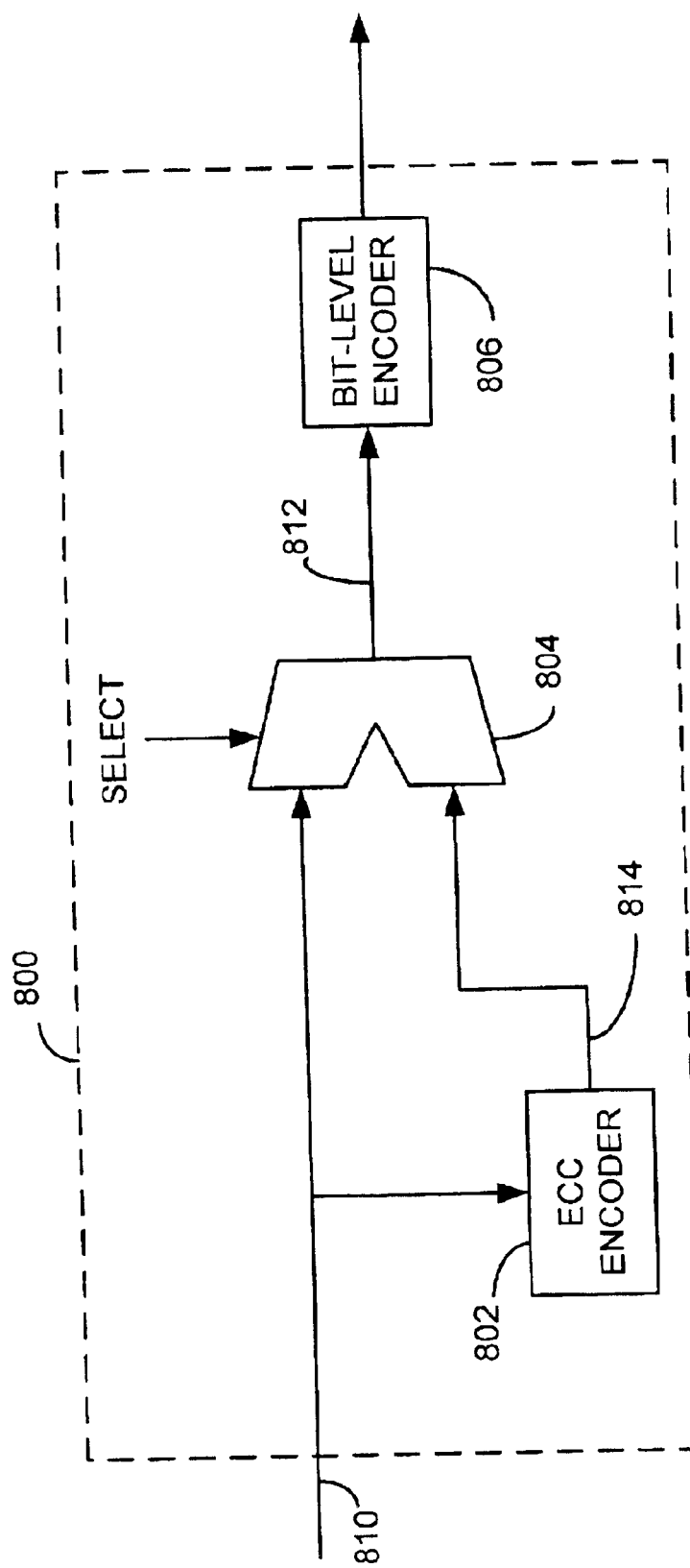
FIG. 8 is a block diagram of an encoder circuit according to an alternative embodiment of the present invention.

FIG. 8 is a block diagram of an encoder circuit 800 according to an alternative embodiment of the present invention, which can be used in replace of encoder circuit 139 shown in FIG. 2. Encoder circuit 800 includes a symbol-level ECC encoder 802, a multiplexer 804 and a bit-level encoder 806. Blocks of successive incoming data words 810 are applied to a first data input of multiplexer 804 for mapping into the data field of a corresponding ECC code word 812 at the output of multiplexer 804. Again, the data field of each ECC code word is divided into a plurality of ECC symbols as discussed above. The blocks of successive data words 810 are also applied to ECC encoder 802, which generates additional ECC symbols 812 for the ECC field based on the ECC symbols in the data field. For example, the additional ECC symbols can be generated by applying the ECC symbols in the data field to a polynomial function. The additional ECC symbols are then applied to a second data input of multiplexer 804. Multiplexer 804 concatenates successive sets of the additional ECC symbols 814 into the ECC fields of successive ECC code words 812.

Bit-level encoder 806 receives each ECC code word 812 and applies similar code constraints as were applied by encoders 140 and 150 in FIG. 2. In one embodiment, encoder 806 is a block encoder which encodes each ECC symbol in ECC code words 812 into a corresponding encoded ECC symbol. Again, the code imposes different constraints on different bit positions, based on the relative position of each bit in the ECC symbol. Since there is a smaller number of bits in each ECC symbol than in each data word 142 (of FIG. 2), the overall code rate of encoding circuit 800 is smaller that the overall code rate of encoding circuit 139. In encoding circuit 139, the majority of the bits of each ECC code word are data bits, which are encoded at a higher rate by bit-level encoder 140. Only a small number of the bits are encoded at a lower rate on an ECC symbol basis by encoder 150. Other encoding variations can also be used in accordance with the present invention.

In summary, one aspect of the present invention relates to a method of encoding data words 142 in which a block 700 of at least one of the data words 142 is mapped into an error correction code (ECC) code word 149, 701. The ECC code word 149, 701 is defined by a plurality of multiple-bit ECC symbols 301, 302, 311, 312, 321, 322, 331, 332 which are separated by boundaries 303, 313, 323, 333. Bit patterns (such as those shown in FIGS. 3-1 and 3-2) are constrained from occurring in the ECC code word 149, 701 based on a relative location 304, 306 of the bit patterns to the boundaries 303, 313, 323, 333.

Another aspect of the present invention is directed to an encoder 139 for encoding successive data words into respective, successive code words. The encoder includes a data word input 142; a code word output 143; and a first encoder unit 140. The first encoder unit 140 maps each successive data word received on the data word input 142 into a respective, successive code word on the code word output 143 according to a first code. The first code identifies in each code word boundaries 303, 313, 323, 333 between multiple-bit error correction code (ECC) symbols 301, 302, 311, 312, 321, 322, 331, 332 and imposes different code constraints on bit positions 304 in each code word that are closer to the boundaries than bit positions 306 in each code word that are farther from the boundaries 303, 313, 323, 333.

Another aspect of the present invention is directed to a disc drive storage channel 138 which includes a transducer 110 and an encoder 139. The transducer 110 is capable of communicating with a data storage disc 106. The encoder 139 is coupled to the transducer 110 for encoding data 142 into successive error correction code (ECC) code words 149, 701 formed of multiple-bit ECC symbols 301, 302, 311, 312, 321, 322, 331, 332 according to a code. The code constrains bit patterns from occurring in each ECC code word 149, 701 based on a relative location 304, 306 of the bit patterns to boundaries 303, 313, 323, 333 between the multiple-bit ECC symbols 301, 302, 311, 312, 321, 322, 331, 332. The encoder 139 then transmits the ECC code words 149, 701 to the transducer 110 as a code word stream 154.

Yet another aspect of the present invention is directed to a disc drive storage channel 138 which includes a transducer 110 and a decoder 168, 172. The transducer 110 is capable of communicating with a data storage disc 106. The decoder 168, 172 is coupled to the transducer 110 for receiving a read signal 164 from the transducer 110 and for decoding successive error correction code (ECC) code words 166 represented by the read signal 164 into successive data words 174 according to a code. Each ECC code word 166 includes a plurality of multiple-bit ECC symbols 301, 302, 311, 312, 321, 322, 331, 332, and the code constrains bit patterns in each ECC code word 166 based on a relative location 304, 306 of the bit patterns to boundaries 303, 313, 323, 333 between the multiple-bit ECC symbols 301, 302, 311, 312, 321, 322, 331, 332.

It is to be understood that even though numerous characteristics and advantages of various embodiments of the invention have been set forth in the foregoing description, together with details of the structure and function of various embodiments of the invention, this disclosure is illustrative only, and changes may be made in detail, especially in matters of structure and arrangement of parts within the principles of the present invention to the full extent indicated by the broad general meaning of the terms in which the appended claims are expressed. For example, the particular elements may vary depending on the particular application for the channel while maintaining substantially the same functionality without departing from the scope and spirit of the present invention. In addition, although the embodiments described herein are directed to read and write channels for a disc drive system, it will be appreciated by those skilled in the art that the teachings of the present invention can be applied to other systems, like communication systems or other storage systems, without departing from the scope and spirit of the present invention. Also, the term "coupled" used in the specification and claims can include a direct connection or a connection through one or more intermediate components.

What is claimed is:

1. A method of encoding data words, the method comprising steps of:
   (a) mapping a block of at least one of the data words into an error correction code (ECC) code word which is defined by a plurality of multiple-bit ECC symbols that are separated by boundaries; and
   (b) constraining bit patterns from occurring in the ECC code word based on a relative location of the bit patterns to the boundaries.

2. The method of claim 1 wherein:
   in step (a), each ECC symbol comprises a plurality of inner bit positions and a plurality of outer bit positions, which are closer to respective ones of the boundaries than the inner bit positions; and
   in step (b), constraining the bit patterns comprises imposing different code constraints on the outer bit positions than on the inner bit positions to avoid selected bit patterns, which are allowed in the inner bit positions, from occurring in the outer bit positions.

3. The method of claim 1 wherein:
   the bit patterns include bit patterns having three consecutive transitions between first and second binary states, wherein a middle one of the transitions occurs at one of the boundaries.

4. The method of claim 1 wherein step (a) comprises:
   (a)(1) encoding each data word into a data code word according to a code which constrains the bit patterns from occurring in the data code word based on a location of the bit patterns in the data code word relative to bit positions in the data code word that correspond to the boundaries between the multiple-bit ECC symbols; and
   (a)(2) mapping a block of at least one of the data code words into a data field of the ECC code word, which comprises a first set of the ECC symbols.

5. The method of claim 4 wherein step (a) further comprises:
   (a)(3) generating a second set of the ECC symbols, which are separated by boundaries, as a polynomial function of the first set of ECC symbols;
   (a)(4) constraining the bit patterns from occurring in the second set of ECC symbols based on a relative location of the bit patterns to the boundaries of the second set of ECC symbols; and
   (a)(5) mapping the second set of ECC symbols into an ECC field of the ECC code word.

6. An encoder for encoding successive data words into respective, successive code words, the encoder comprising:
   a data word input;
   a code word output; and
   a first encoder unit which maps each successive data word received on the data word input into a respective, successive code word on the code word output according to a first code, wherein the first code identifies in each code word boundaries between multiple-bit error correction code (ECC) symbols and imposes different code constraints on bit positions in each code word that are closer to the boundaries than bit positions in each code word that are farther from the boundaries.

7. The encoder of claim 6 and further comprising:
   an ECC encoder which receives the successive code words from the first encoder unit and maps a block of at least one of the code words into a data field of an ECC code word and concatenates an ECC field onto the data field based on the data field and a predetermined ECC polynomial function, wherein the ECC code word is defined by a plurality of multiple-bit ECC symbols within the data field and the ECC field.

8. The encoder of claim 7 and further comprising:
   a second encoder unit which maps each ECC symbol in the ECC field into an encoded ECC symbol according to a second code, wherein the second code identifies boundaries between the encoded ECC symbols in the ECC field and imposes different code constraints on bit positions in each encoded ECC symbol that are closer to the boundaries in the ECC field than bit positions that are farther from the boundaries in the ECC field.

9. The encoder of claim 8 wherein the first and second codes prevent selected bit patterns from occurring in the ECC code word, wherein the selected bit patterns include bit patterns having three consecutive transitions between first and second binary states with a middle one of the transitions occurring at one of the ECC symbol boundaries in the ECC code word.

10. A disc drive storage channel comprising:
    a transducer capable of communicating with a data storage disc; and
    encoding means coupled to the transducer for encoding data into successive error correction code (ECC) code words formed of multiple-bit ECC symbols according to a code, wherein the code constrains bit patterns from occurring in each ECC code word based on a relative location of the bit patterns to boundaries between the multiple-bit ECC symbols, and for transmitting the ECC code words to the transducer as a code word stream.

11. A disc drive storage channel comprising:
    a transducer capable of communicating with a data storage disc; and decoding means coupled to the transducer for receiving a read signal from the transducer and for decoding successive error correction code (ECC) code words represented by the read signal into successive data words according to a code, wherein each ECC code word comprises a plurality of multiple-bit ECC symbols and the code constrains bit patterns in each ECC code word based on a relative location of the bit patterns to boundaries between the multiple-bit ECC symbols.

* * * * *